United States Patent
Leitner et al.

(10) Patent No.: US 7,566,624 B2
(45) Date of Patent: Jul. 28, 2009

(54) METHOD FOR THE PRODUCTION OF TRANSISTOR STRUCTURES WITH LDD

(75) Inventors: Othmar Leitner, Graz (AT); Rainer Minixhofer, Unterpremstätten (AT); Georg Röhrer, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 444 days.

(21) Appl. No.: 10/579,487

(22) PCT Filed: Oct. 25, 2004

(86) PCT No.: PCT/EP2004/012031

§ 371 (c)(1),
(2), (4) Date: May 16, 2006

(87) PCT Pub. No.: WO2005/050731

PCT Pub. Date: Jun. 2, 2005

(65) Prior Publication Data

US 2007/0128817 A1    Jun. 7, 2007

(30) Foreign Application Priority Data

Nov. 18, 2003  (DE) ................................ 103 53 772

(51) Int. Cl.
    *H01L 21/336*   (2006.01)
(52) U.S. Cl. ........................ 438/299; 438/301; 438/302; 438/303
(58) Field of Classification Search ................. 438/299, 438/301–307

See application file for complete search history.

(56) References Cited

U.S. PATENT DOCUMENTS

| 5,538,909 A | 7/1996 | Hsu |
| 6,010,936 A | 1/2000 | Son |
| 6,040,602 A | 3/2000 | Fulford et al. |

(Continued)

FOREIGN PATENT DOCUMENTS

JP        61226968        10/1986

(Continued)

OTHER PUBLICATIONS

Translation of International Preliminary Examination Report for Application No. PCT/EP2004/012031.

(Continued)

*Primary Examiner*—Kevin M Picardat
(74) *Attorney, Agent, or Firm*—Fish & Richardson P.C.

(57) ABSTRACT

A method for producing a transistor structure with a lightly doped drain (LDD) includes structuring a gate electrode on a gate dielectric. The method also includes etching the semiconductor body or substrate to form sloping sidewalls on regions adjacent to the gate electrode, and anisotropically back-etching the spacer layer to form spacers. The gate electrode is used as a mask to implant dopant to form a source region, a drain region, and regions of lower dopant concentration. Implanting dopant is performed at a first angle relative to the upper surface of the semiconductor body or substrate to form the source and drain regions, and at a second angle relative to the upper surface of the semiconductor body or substrate, and through the spacers, to form the regions of lower dopant concentration. The first angle is greater than the second angle.

20 Claims, 2 Drawing Sheets

U.S. PATENT DOCUMENTS

2002/0003290 A1   1/2002   Namatame et al.

FOREIGN PATENT DOCUMENTS

| JP | 04368133 | 12/1992 |
| JP | 05-343674 | 12/1993 |
| JP | 05343674 | 12/1993 |
| JP | 07094714 | 5/1995 |
| JP | 07142728 | 6/1995 |
| JP | 11111979 | 4/1999 |

OTHER PUBLICATIONS

Translation of Written Opinion for Application No. PCT/EP2004/012031.

METHOD FOR THE PRODUCTION OF TRANSISTOR STRUCTURES WITH LDD

TECHNICAL FIELD

This patent application relates to the production of field effect transistors with LDD.

BACKGROUND

In the production of MOSFET structures, especially within the framework of a CMOS process, so-called LDD regions (lightly doped drain) are formed on the source side and the drain side of the channel for the purpose of improving the functional performance of the transistor. This measure serves to reduce short channel effects, especially DIBL, punch-through, GIDL and $V_t$ roll-off, for example. The LDD regions are formed between the source region and the channel region, and between the channel region and the drain region. They reduce the otherwise very high electric field intensities between the source region and/or drain region and the channel region.

In the production of complementary transistors within the framework of a CMOS process, the transistors intended as a first type are masked. The remaining transistors then undergo an implantation of low-dose dopant, in order to produce the LDD regions. The mask is removed, and the transistors that were previously implanted are shielded using another mask. This is followed by an implantation of dopant of the opposite conductivity type, whereby the LDD regions of the complementary transistors are produced. In order to adequately offset the source regions and drain regions, which will subsequently be implanted, from the channel regions, and thereby to suppress a potential punch-through, reduce the GIDL effect and minimize a degradation of the MOSFET by hot carrier effects, sidewall spacers are set up on the source-side and drain-side sidewalls of the gate electrodes. In order to allow the implantation of the dopant for the source regions and drain regions at a higher dopant concentration, two additional masks must then be used to cover the transistors of both types. This requires a total of four masks. Due to the benefits that have been realized through LDD regions, other such structures have been developed and studied, such as LATID (large-angle tilted implant drain) and DDD, for example.

SUMMARY

In the process described here, for each transistor type only a single mask is required, which is used in each case to shield the opposite transistor type. In order to allow implantation of the different dopant concentrations for the source and drain regions and the adjacent lower doped regions, hereinafter referred to as LDD regions for purposes of simplicity, sidewalls are produced in the substrate or semiconductor body on the source side and the drain side, which are adjacent to the gate electrode and slope downward toward the outside from the gate electrode. Prior to implantation, sidewall spacers are produced on the source-side and drain-side sidewalls of the gate electrode by anisotropically back etching a conformally deposited layer. The sidewall spacers at least partially cover the sidewalls of the gate electrode and the sloping sidewalls in the substrate.

A high-angle implantation, preferably as vertical as possible, striking the surface of the substrate is used to apply the dopant for the source/drain regions in a high concentration. A low-angle, lower dose implantation at an angle of between 30° and 60°, for example approximately 45°, from the original upper surface of the substrate is performed in order to create the LDD regions. In this step the atoms of the dopant penetrate through the sidewall spacers into the semiconductor material. With the typical shape of the spacers and the proper slope of the sidewalls formed in the substrate, the thickness of the spacers decreases toward the source/drain regions, such that there, adjacent to the source/drain regions, the LDD regions can be created with the desired dopant concentration.

Below a more detailed description of examples of the method is provided, with reference to the attached drawings.

DETAILED DESCRIPTION

Figure 1:
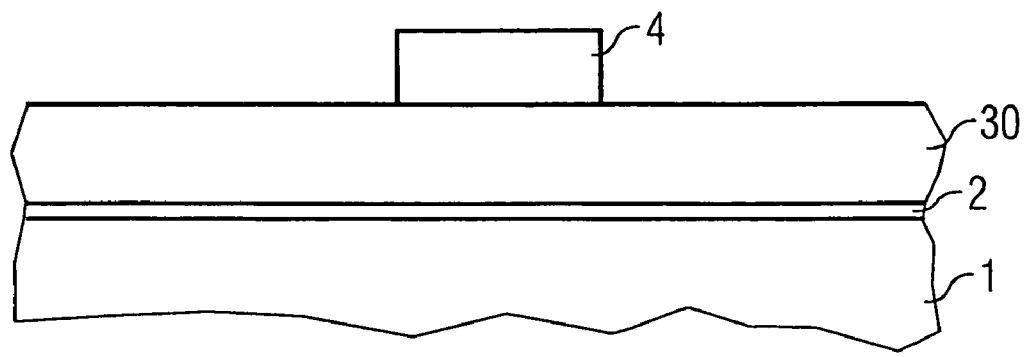
FIG. 1 shows a cross-sectional view of a multilayer arrangement for structuring the gate electrode.

In one preferred embodiment of the process, according to the cross-section shown in FIG. 1, a gate dielectric 2 and an electrode layer 30, for example made of polysilicon, that is provided for the gate electrode are applied to the essentially planar upper surface of a substrate 1 or a semiconductor body, for example made of silicon, with basic doping or a doped trough.

A resist mask 4 is created on top of this, which is structured to correspond to the gate electrode to be produced.

Figure 2:
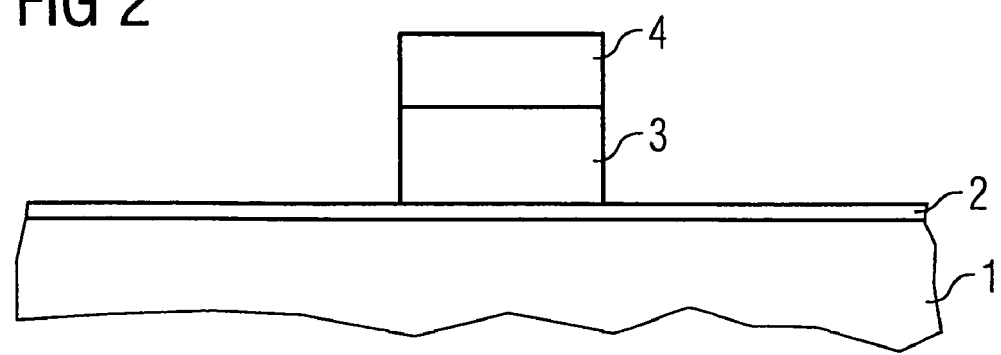
FIG. 2 shows the arrangement of FIG. 1 with a structured gate electrode.

FIG. 2 shows the cross-section from FIG. 1 after the gate electrode 3 has been constructed using the resist mask 4. The longitudinal axis of the channel lies within the plane of the drawing. Thus the regions intended for the source and the drain lie to the left and the right below the gate electrode 3. As can be seen from FIG. 2, during etching of the material of the gate electrode 3 the gate dielectric layer 2 acts as an etching stop layer. The composition of the etching gas is then modified so that the layer of the gate dielectric to the sides of the gate electrode 3 can be removed, and etching can continue further into the substrate 1. The photosensitive resist of the resist mask 4 may also be removed prior to etching of the substrate, if necessary.

Figure 3:
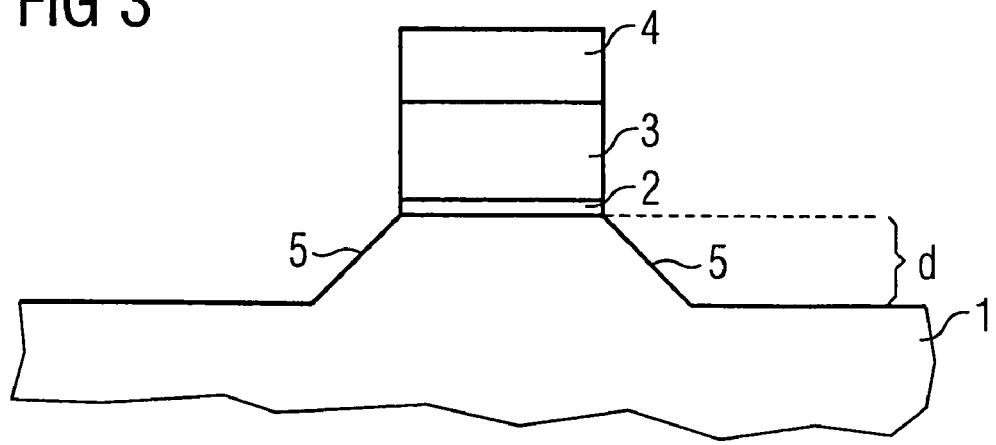
FIG. 3 shows an intermediate product stage after etching of the sloping sidewalls in the upper surface of the substrate.

Etching is continued until the upper surface of the substrate has been lowered to a level d as shown in FIG. 3. At the same time, on the source-side and drain-side walls of the gate electrode 3 sloping sidewalls 5 that slope downward toward the outside from the gate electrode 3 are formed. In the example shown in the FIG. 3 these sidewalls 5 have a 45° downward slope relative to the remaining, essentially planar substrate upper surface, or to the plane of the original upper surface of the substrate. With the proper adjustment of the etching rates in the horizontal and vertical etching directions, however, other slope angles may also be used here. In this process slope angles of 30° to 60° are preferred, wherein the sloping sidewalls 5 are preferably designed to be mirror symmetrical relative to the gate electrode 3, but in principle may also have different slope angles. The depth d of this etching is preferably 20 nm to 200 nm, typically for example approximately 100 nm. In the etching of the substrate, the sloping sidewalls 5 can be etched somewhat underneath the gate electrode 3 (underetch).

Figure 4:
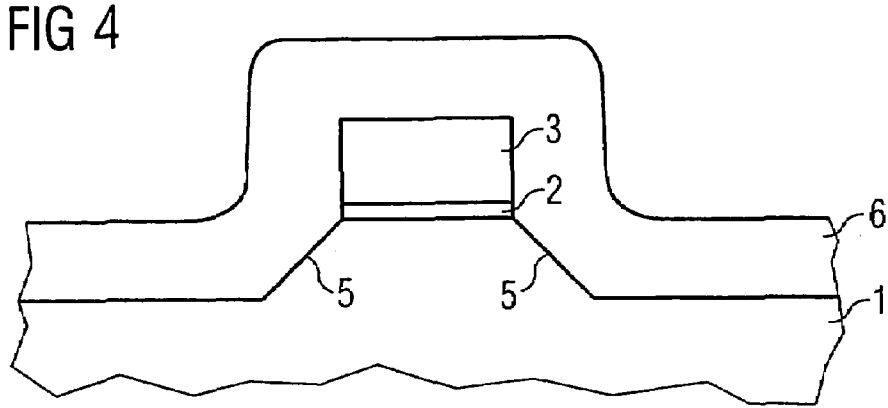
FIG. 4 shows a further intermediate product stage after deposition of the spacer layer.

As is shown in FIG. 4 a spacer layer 6, which is preferably oxide and can be applied, for example, in a typical thickness of approximately 150 nm to 160 nm, is then isotropically deposited, conforming with the edges. The thickness that is required is also linked to the depth d; its maximum should be approximately 200 nm. The depth d, the thickness of the spacer layer 6, the slope angle of the sloping sidewalls 5 and the dimensions of the structure are coordinated with one another. The spacer layer 6 is then anisotropically back etched using known methods, in order to form sidewall spacers on the sidewalls of the gate electrode.

Figure 5:
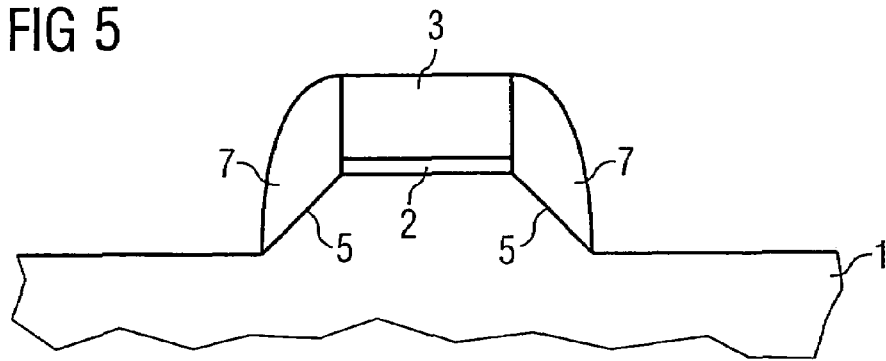
FIG. 5 shows the structure following etching of the sidewall spacers.

FIG. 5 illustrates the structure produced in this manner with the spacers 7 on the source-side and drain-side sidewalls of the gate electrode 3. The spacers 7 cover the sloping sidewalls 5, wherein FIG. 5 clearly shows that the thickness of the spacers 7, measured in a direction that is perpendicular to the plane of the sloping sidewalls 5, decreases toward the substrate. Below a plane that is defined by the gate dielectric 2, the cross-section of the spacer 7 is nearly triangular in shape. The first mask can then be applied to cover the transistor regions that are intended for a first type of transistor. This is followed by implantation to form the source regions, the drain regions, and the LDD regions. In a p-doped trough in the substrate 1 a dopant for n-type conductivity is applied, and vice versa.

Figure 6:
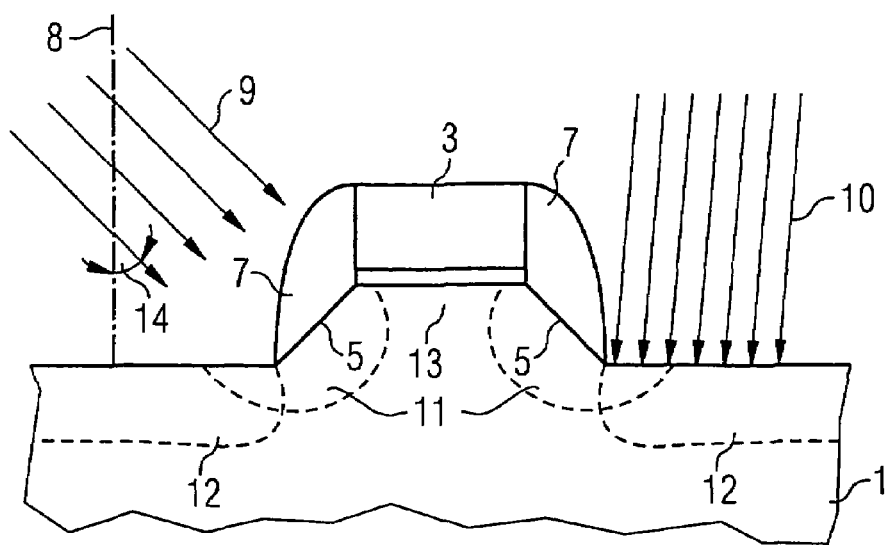
FIG. 6 shows the production of the LDD regions and the source and drain regions.

In FIG. 6 the creation of the source and drain regions 12 and the regions 11 of lower dopant concentration, hereinafter abbreviated to LDD regions 11 without the intention of restricting them as such, are schematically illustrated. In FIG. 6 the surface normal 8 is indicated on the upper surface of the substrate 1 that has been lowered by the depth d. The cross-section shown here lies within the plane that is oriented vertically on the upper surface of the substrate and vertically on the plane of the sloping sidewalls 5.

The low-dose implantation 9 intended for the LDD regions is performed in a direction that in this cross-section shown in FIG. 6 is tilted from the surface normal 8 by the angle 14. The angle 14 of the low-dose implantation 9 may correspond to the slope angle of the sidewalls 5 against the upper surface of the substrate, but may also deviate from this; it preferably lies within a range of between 30° and 60°. Sufficient dopant penetrates through the thin lower portion of the spacer 7 into the substrate to form the LDD regions 11. In the example shown here the LDD regions 11 extend somewhat underneath the gate electrode 3. Between them is the channel region 13.

Another, high-dose implantation 10 is performed in order to produce the source regions and drain regions 12. The implantation sequence is arbitrary, in principle. The preferred sequence is to produce the LDD regions prior to production of the source and drain regions. The direction of the high-dose implantation 10 should deviate from the surface normal 8 at most by an angle of approximately 7°, in order to ensure that the source-drain regions will be offset sufficiently from the channel region 13.

In other embodiments that differ from the preferred exemplary embodiment that is illustrated in an idealized form in the drawings, the sidewalls can especially be curved toward the substrate, or designed to be otherwise uneven. In such cases the above-mentioned slope angle for the sidewalls of 30° to 60° from the upper surface of the substrate is properly defined by a plane that approximates the sidewalls. This plane is defined, for example, by the relevant lower edge of the gate electrode and the transition between the sloping sidewall and the horizontal portion of the upper surface of the substrate.

The spacers 7 need not necessarily precisely cover the sidewalls of the gate electrode and the sloping sidewalls 5 as shown in FIG. 5. Instead, for example, a lower portion of the sloping sidewalls 5 and/or an upper portion of the sidewalls of the gate electrode may remain uncovered by the spacers 7. It may also be provided that the spacers 7 also cover a portion of the horizontal upper surface or the substrate 1. The diagrams shown in FIGS. 5 and 6 are idealized in these terms. The spacers should be sufficiently thin, at least in their lower portion, in the direction intended for implantation of the low dopant concentration to allow sufficient dopant to penetrate, and that in the direction that is perpendicular to the upper surface of the substrate, they form an adequate gate-side shielding against the high-angle source/drain implantations.

The invention claimed is:

1. A method for producing a transistor structure with a lightly doped drain (LDD), the method comprising:
   structuring a gate electrode on a gate dielectric, the gate dielectric being on a substantially planar upper surface of a semiconductor body or substrate;
   etching the semiconductor body or substrate to form sloping sidewalls on regions adjacent to the gate electrode, the sloping sidewalls sloping downward from the gate electrode;
   depositing a spacer layer over at least part of the sloping sidewalls and the gate electrode;
   anisotropically back-etching the spacer layer to form spacers, the spacers at least partially covering source-side and drain-side sidewalls of the gate electrode and the sloping sidewalls;
   using the gate electrode as a mask, implanting dopant in the semiconductor body or substrate to form a source region, a drain region, and regions of lower dopant concentration, the regions of lower dopant concentration being adjacent to the source and drain regions and adjacent to a channel between the source and drain regions;
   wherein implanting dopant is performed at a first angle relative to the upper surface of the semiconductor body or substrate to form the source and drain regions, wherein implanting dopant at a first angle is performed after formation of the spacers; and
   wherein implanting dopant is performed at a second angle relative to the upper surface of the semiconductor body or substrate, and through the spacers, to form the regions of lower dopant concentration, the first angle being greater than the second angle.

2. The method of claim 1, wherein the sloping sidewalls are formed at angles of 30° to 60° from the upper surface of the semiconductor body or substrate.

3. The method of claim 2, wherein the sloping sidewalls are formed at angles of 45° from the upper surface of the semiconductor body or substrate.

4. The method of claim 1, wherein implanting dopant at the second angle is performed in a direction that forms an angle of between 30° and 60° with a surface normal to the upper surface of the semiconductor body or substrate.

5. The method of claim 1, wherein implanting to form the source and drain regions is performed in a direction that forms an angle of between 0° and 7° with a surface normal to the upper surface of the semiconductor body or substrate.

6. The method of claim 1, wherein etching comprises etching at least some of the semiconductor body or the substrate underneath the gate electrode.

7. The method of claim 1, wherein etching comprises removing between 20 nm and 200 nm of the semiconductor body or the substrate.

8. The method of claim 2, wherein implanting to form the regions of lower dopant concentration is performed in a direction that forms an angle of between 30° and 60° with a surface normal to the upper surface of the semiconductor body or substrate.

9. The method of claim 2, wherein implanting to form the source and drain regions is performed in a direction that forms an angle of between 0° and 7° with a surface normal to the upper surface of the semiconductor body or substrate.

10. The method of claim 4, wherein implanting to form the source and drain regions is performed in a direction that forms an angle of between 0° and 7° with a surface normal to the upper surface of the semiconductor body or substrate.

11. The method of claim 1, wherein implanting dopant at the second angle is performed before implanting dopant at the first angle.

12. The method of claim 4, wherein implanting dopant at the second angle is performed before implanting dopant at the first angle.

13. The method of claim 1, wherein a sloping sidewall on the source-side and a sloping sidewall on the drain side slope downward from the gate electrode at substantially same angles.

14. A method for producing a device structure, comprising:
forming a gate electrode on a gate dielectric, the gate dielectric being on an upper surface of a semiconductor;
removing at least part of the semiconductor to form sloping sidewalls adjacent to the gate electrode, the sloping sidewalls sloping downward relative to the gate electrode;
forming spacers at sides of the gate electrode and adjacent to the sloping sidewalls;
implanting dopant at a first angle relative to the upper surface of the semiconductor to form source and drain regions in the semiconductor, wherein implanting the dopant at the first angle is performed after forming the spacers; and
implanting dopant at a second angle relative to the upper surface of the semiconductor, and through the spacers, to form regions of lower dopant concentration in the semiconductor, the regions of lower dopant concentration being adjacent to a channel between the source and drain regions;
wherein the first angle is greater than the second angle.

15. The method of claim 14, wherein the sloping sidewalls are formed at angles of 30° to 60° from the upper surface of the semiconductor.

16. The method of claim 15, wherein the sloping sidewalls are formed at angles of 45° from the upper surface of the semiconductor.

17. The method of claim 14, wherein implanting at the second angle is performed in a direction that forms an angle of between 30° and 60° with a surface normal to the upper surface of the semiconductor.

18. The method of claim 14, wherein implanting to form the source and drain regions is performed in a direction that forms an angle of between 0° and 7° with a surface normal to the upper surface of the semiconductor.

19. The method of claim 14, wherein implanting dopant at the second angle is performed before implanting dopant at the first angle.

20. The method of claim 17, wherein implanting dopant at the second angle is performed before implanting at the first angle.

* * * * *

UNITED STATES PATENT AND TRADEMARK OFFICE
CERTIFICATE OF CORRECTION

PATENT NO. : 7,566,624 B2  Page 1 of 1
APPLICATION NO. : 10/579487
DATED : July 28, 2009
INVENTOR(S) : Othmar Leitner It is certified that error appears in the above-identified patent and that said Letters Patent is hereby corrected as shown below:

Cover page, item [57] Abstract, Line 4:
Delete "sidewails" and Insert --sidewalls--

Column 6, Claim 20, Line 30:
Delete "at" and Insert --dopant at--

Signed and Sealed this

Twenty-sixth Day of January, 2010

David J. Kappos
*Director of the United States Patent and Trademark Office*